(12) United States Patent
Seyama

(10) Patent No.: US 9,406,640 B2
(45) Date of Patent: Aug. 2, 2016

(54) FLIP CHIP BONDER AND METHOD OF CORRECTING FLATNESS AND DEFORMATION AMOUNT OF BONDING STAGE

(71) Applicant: Shinkawa Ltd., Tokyo (JP)

(72) Inventor: Kohei Seyama, Tokyo (JP)

(73) Assignee: SHINKAWA LTD., Tokyo (JP)

( * ) Notice: Subject to any disclaimer, the term of this patent is extended or adjusted under 35 U.S.C. 154(b) by 0 days.

(21) Appl. No.: 14/743,050

(22) Filed: Jun. 18, 2015

(65) Prior Publication Data

US 2016/0043053 A1 Feb. 11, 2016

Related U.S. Application Data

(63) Continuation of application No. PCT/JP2013/084042, filed on Dec. 19, 2013.

(30) Foreign Application Priority Data

Dec. 21, 2012 (JP) .................................. 2012-278884

(51) Int. Cl.
*B23K 31/02* (2006.01)
*B23K 37/00* (2006.01)
(Continued)

(52) U.S. Cl.
CPC . *H01L 24/75* (2013.01); *B23K 3/00* (2013.01); *B23K 1/0016* (2013.01); *B23K 37/04* (2013.01);
(Continued)

(58) Field of Classification Search
None
See application file for complete search history.

(56) References Cited

U.S. PATENT DOCUMENTS

| 4,103,814 A | * | 8/1978 | Nishioka | .................. G03F 9/70 |
| | | | | 228/180.21 |
| 4,116,376 A | * | 9/1978 | Delorme | ........... H01L 21/67144 |
| | | | | 228/105 |

(Continued)

FOREIGN PATENT DOCUMENTS

| JP | 03185844 A | * | 8/1991 |
| JP | 05-291354 | | 11/1993 |

(Continued)

OTHER PUBLICATIONS

International Search Report dated Dec. 17, 2013, from related International Application No. PCT/JP2013/075478.

(Continued)

*Primary Examiner* — Kiley Stoner
(74) *Attorney, Agent, or Firm* — Katten Muchin Rosenman LLP

(57) ABSTRACT

Provided is a flip chip bonder including: a base (12); a bonding stage (20); a plurality of vertical-position adjustment support mechanisms (30) attached to the base (12), and respectively configured to support, in a vertical direction, the bonding stage (20) at a plurality of supporting points being provided on a lower surface (22) of the bonding stage (20), and to adjust positions of the supporting points in the vertical direction; and a leaf spring mechanism (40) configured to connect the base (12) with the bonding stage (20). The leaf spring mechanism (40) restrains movement of the bonding stage (20) relative to the base (12) in an X axis along a surface (21) of the bonding stage (20) and a Y axis perpendicular to the X axis, and allows first twisting about the X axis and second twisting about the Y axis of the bonding stage (20) relative to the base (12), and movement of the bonding stage (20) relative to the base (12) in the vertical direction. This provides the flip chip bonder with improved bonding quality and increased bonding speed.

19 Claims, 11 Drawing Sheets

(51) Int. Cl.
- *H01L 23/00* (2006.01)
- *B23K 3/00* (2006.01)
- *B23K 37/04* (2006.01)
- *B23K 1/00* (2006.01)

(52) U.S. Cl.
CPC .............. *H01L 24/13* (2013.01); *H01L 24/81* (2013.01); *H01L 2224/13082* (2013.01); *H01L 2224/13101* (2013.01); *H01L 2224/16225* (2013.01); *H01L 2224/7592* (2013.01); *H01L 2224/75701* (2013.01); *H01L 2224/75703* (2013.01); *H01L 2224/75744* (2013.01); *H01L 2224/75824* (2013.01); *H01L 2224/75842* (2013.01); *H01L 2224/81815* (2013.01)

(56) References Cited

U.S. PATENT DOCUMENTS

| | | | | |
|---|---|---|---|---|
| 4,526,646 A | * | 7/1985 | Suzuki | H01L 21/67138 156/230 |
| 4,659,004 A | * | 4/1987 | Fridman | B23K 1/012 228/49.1 |
| 5,113,581 A | * | 5/1992 | Hidese | B23K 3/0471 228/180.22 |
| 5,462,216 A | * | 10/1995 | Nishimura | B23K 1/00 228/47.1 |
| 5,884,831 A | * | 3/1999 | Sato | B23K 20/10 228/49.5 |
| 5,982,132 A | * | 11/1999 | Colby | H01L 21/68 269/71 |
| 7,404,511 B2 | * | 7/2008 | Kimino | H01L 21/288 228/11 |
| 8,070,039 B1 | * | 12/2011 | Johnson | B23K 20/1205 228/2.1 |
| 2002/0174959 A1 | * | 11/2002 | Yanagita | H01L 21/67092 156/750 |
| 2005/0061856 A1 | * | 3/2005 | Maki | H01L 21/561 228/234.1 |
| 2005/0284915 A1 | * | 12/2005 | Beatson | B23K 20/004 228/4.5 |
| 2007/0181245 A1 | * | 8/2007 | Kaneshima | B29C 63/02 156/229 |
| 2008/0105383 A1 | * | 5/2008 | Kubo | H01L 21/67132 156/494 |
| 2010/0024667 A1 | * | 2/2010 | Ikura | B30B 15/067 100/38 |
| 2011/0036897 A1 | * | 2/2011 | Nakai | H01L 21/67092 228/1.1 |
| 2011/0214809 A1 | * | 9/2011 | Sugiyama | B23B 37/10 156/285 |
| 2013/0087949 A1 | * | 4/2013 | Kitahara | H01L 21/78 264/400 |
| 2013/0118530 A1 | * | 5/2013 | Komeda | H01L 21/67092 134/21 |
| 2013/0248114 A1 | * | 9/2013 | Seok | H01L 21/6838 156/382 |
| 2013/0319985 A1 | * | 12/2013 | Nomaru | B23K 26/0665 219/121.75 |
| 2014/0150981 A1 | * | 6/2014 | Itou | B23B 38/1858 156/714 |
| 2015/0194329 A1 | * | 7/2015 | Katsuragawa | H01L 21/68 382/151 |
| 2015/0333032 A1 | * | 11/2015 | Kakutani | H01L 24/75 438/106 |

FOREIGN PATENT DOCUMENTS

| | | |
|---|---|---|
| JP | 09-129677 | 5/1997 |
| JP | 10-275833 A | 10/1998 |
| JP | 2000-019361 A | 1/2000 |
| JP | 2001-168146 A | 6/2001 |
| JP | 2006-339464 A | 12/2006 |
| JP | 2010-114102 A | 5/2010 |
| JP | 2010-114103 A | 5/2010 |
| JP | 2012-174861 A | 9/2012 |

OTHER PUBLICATIONS

Written Opinion of the International Searching Authority dated Dec. 17, 2013, from related International Application No. PCT/JP2013/075478.

File History from related U.S Appl. No. 14/847,295.

International Search Report dated Mar. 25, 2014, from corresponding International Application No. PCT/JP2013/084042.

* cited by examiner

FLIP CHIP BONDER AND METHOD OF CORRECTING FLATNESS AND DEFORMATION AMOUNT OF BONDING STAGE

TECHNICAL FIELD

The present invention relates to a structure of a flip chip bonder and a method of correcting flatness and a deformation amount of a bonding stage.

BACKGROUND ART

A flip chip bonding method of mounting a chip on a substrate by forming a solder film by resist or the like at a tip of a pillar formed on an electrode of the chip, turning the chip over, pressing the solder film formed at the tip of the pillar against an electrode of the substrate, and heating the solder to be molten, has been widely used. A device used for mounting a chip on a substrate by flipping the chip over in this manner is referred to as a flip chip bonder. Further, in recent years, it has become more common to manufacture electronic components in which chips are stacked by flip chip bonding of a chip onto another chip on a wafer, instead of a substrate.

In the flip chip bonding method, as a plurality of electrodes on a chip are connected to a plurality of electrodes on substrate at one time, it is important to maintain the chip parallel to the substrate, so that surfaces of solder films formed at tips of pillars on the electrodes of the chip are brought into contact with the electrodes of the substrate at the same time. Thus, there is proposed a method of using three support mechanisms movable in a vertical direction to support a bonding stage on which a substrate is held by suctioning, and adjusting an inclination of a surface of the bonding stage so as to maintain parallelism between the bonding stage and a bonding tool (e.g., PTLs 1 and 2).

CITATION LIST

Patent Literature

PTL 1: Japanese Unexamined Patent Application Publication No. 2010-114102
PTL 2: Japanese Unexamined Patent Application Publication No. 2010-114103

SUMMARY OF INVENTION

Technical Problem

In recent years, the size of chips has become larger, and it has become more common that more than 1000 electrodes are connected at the same time. In addition, the thickness of solder films formed at tips of pillars on an electrode has also been reduced down to around 5 µm to 10 µm. Further, it is now required that in order to bond more than 1000 pillars onto electrodes of a substrate at the same time, a tip surface and an electrode surface of the substrate are brought close to each other within the thickness of the solder film. Moreover, as the number of electrodes of a chip increases, the bonding force required for pressing the chip also increases. In recent years, the pressing force required in bonding is sometimes as large as 500 N. This means that the pressing force as large as the weight of one person are to be applied to a chip and to a bonding stage. In this case, there is a problem that deformation of the bonding stage due to the high bonding force may cause the force applied to the chip, a wafer, the substrate, and the like to be unevenly distributed, and the electrodes or the pillars may be subjected to partial contact, resulting in reduction of bonding quality.

Further, the flip chip bonding method also heats a bonding stage along with a bonding tool in order to melt solder. However, similarly to the deformation of the bonding stage itself, there is a problem that the rise of temperatures due to the heating may cause partial contact of the electrodes or the pillars, also resulting in reduction of bonding quality.

Moreover, the bonding stage of the flip chip bonder is fixed on an XY table, and moves in XY directions at high speed during bonding. This results in a problem that it is difficult to perform favorable high speed bonding, as a supporting structure in which shafts having a spherical tip are simply fitted in V-shaped grooves that are displaced from each other by 120 degrees, as in the conventional technique described in PTL 1, cannot stand the lateral bonding force when the bonding stage moves at high speed, and the position of the bonding stage may go out of place or the bonding stage may be vibrated.

Thus, an object of the present invention is to provide a flip chip bonder with improved bonding quality and increased bonding speed.

Solution to Problem

A flip chip bonder according to the present invention includes: a base body; a bonding stage for suctioning and fixing a bonding target; a plurality of vertical-position adjustment support mechanisms attached to the base body, and respectively configured to support the bonding stage at a plurality of supporting points in a vertical direction, and to adjust positions of the respective supporting points in the vertical direction, the supporting points being provided on a side opposite of a surface for suctioning and fixing the bonding target of the bonding stage; and a connecting member configured to connect the base body with the bonding stage, and the flip chip bonder is configured such that the connecting member: restrains movement of the bonding stage relative to the base body in directions along a first axis and a second axis, the first axis being a direction along the surface of the bonding stage, the second axis being a direction along the surface of the bonding stage but perpendicular to the first axis; and allows first twisting of the bonding stage relative to the base body about the first axis, second twisting of the bonding stage relative to the base body about the second axis, and movement of the bonding stage relative to the base body in the vertical direction.

It is preferable that the flip chip bonder according to the present invention is configured such that the connecting member is configured as a leaf spring mechanism substantially in a trapezoidal shape having a first side and a second side parallel to each other, the leaf spring mechanism including a first flexible portion adjacent to and extending along the first side, a second flexible portion adjacent to and extending along the second side, and a rigid portion between the first flexible portion and the second flexible portion, and the connecting member is disposed between the base body and the bonding stage such that the first side and the second side are parallel to one of the first axis and the second axis.

It is preferable that the flip chip bonder according to the present invention is configured such that the first side of the leaf spring mechanism is shorter than the second side, the first side of the leaf spring mechanism is attached to a first position on the side opposite of the surface of the bonding stage, the first position being displaced by a first distance from a gravity center of the bonding stage, and the second side of the leaf spring mechanism is attached to a second position on the base body on a surface facing the bonding stage, the second position being provided on a side opposite of the first position across the gravity center and displaced by a second distance from the gravity center, the second distance being longer than the first distance.

It is preferable that the flip chip bonder according to the present invention further includes a plurality of pressurized springs configured to respectively press the supporting points of the bonding stage onto the corresponding vertical-position adjustment support mechanisms, and is configured such that each of the vertical-position adjustment support mechanisms includes a cam mechanism in contact with the corresponding supporting point.

It is preferable that the flip chip bonder according to the present invention further includes a control unit configured to operate the vertical-position adjustment support mechanisms, and is configured such that the control unit includes: a flatness map indicating flatness of each of sections on the bonding stage; and a flatness correction unit configured to correct a height and an inclination of the bonding stage based on the flatness map according to a position of bonding.

It is preferable that the flip chip bonder according to the present invention further includes a control unit configured to operate the vertical-position adjustment support mechanisms, and is configured such that the control unit includes: an expected deformation amount map indicating an expected deformation amount of each of sections on the bonding stage due to a pressing force when a bonding tool is pressed against the bonding stage; and a deformation amount correction unit configured to correct a height and an inclination of the bonding stage by the expected deformation amount of the bonding stage according to a pressed position and the pressing force during bonding.

It is preferable that the flip chip bonder according to the present invention is configured such that the bonding stage includes: a first layer having a low thermal conductivity; a second layer having higher thermal conductivity than that of the first layer and substantially the same thermal expansion rate as the first layer; a third layer configured by a material similar to that of the second layer; and a heater disposed between the second layer and the third layer.

A method of correcting flatness of a bonding stage according to the present invention includes the steps of: preparing a flip chip bonder including: a base body; a bonding stage for suctioning and fixing a bonding target; a plurality of vertical-position adjustment support mechanisms attached to the base body, and respectively configured to support the bonding stage at a plurality of supporting points in a vertical direction, and to adjust positions of the respective supporting points in the vertical direction, the supporting points being provided on a side opposite of a surface for suctioning and fixing the bonding target of the bonding stage; a connecting member configured to connect the base body with the bonding stage; and a control unit configured to operate the vertical-position adjustment support mechanisms; preparing a flatness map indicating flatness of each of sections on the bonding stage within the control unit; and correcting a height and an inclination of the bonding stage based on the flatness map according to a position of bonding by causing the control unit to operate the plurality of vertical-position adjustment support mechanisms. Further, in the method of correcting flatness of a bonding stage according to the present invention, it is preferable that the connecting member: restrains movement of the bonding stage relative to the base body in directions along a first axis and a second axis, the first axis being a direction along the surface of the bonding stage, the second axis being a direction along the surface of the bonding stage but perpendicular to the first axis; and allows first twisting of the bonding stage relative to the base body about the first axis, second twisting of the bonding stage relative to the base body about the second axis, and movement of the bonding stage relative to the base body in the vertical direction.

A method of correcting a deformation amount of a bonding stage according to the present invention includes the steps of: preparing a flip chip bonder including: a base body; a bonding stage for suctioning and fixing a bonding target; a plurality of vertical-position adjustment support mechanisms attached to the base body, and respectively configured to support the bonding stage at a plurality of supporting points in a vertical direction, and to adjust positions of the respective supporting points in the vertical direction, the supporting points being provided on a side opposite of a surface for suctioning and fixing the bonding target of the bonding stage; a connecting member configured to connect the base body with the bonding stage; and a control unit configured to operate the vertical-position adjustment support mechanisms; preparing an expected deformation amount map indicating an expected deformation amount of each of sections on the bonding stage due to a pressing force when a bonding tool is pressed against the bonding stage within the control unit; and correcting a height and an inclination of the bonding stage by the expected deformation amount of the bonding stage according to a pressed position and the pressing force during bonding by causing the control unit to operate the plurality of vertical-position adjustment support mechanisms. Further, in the method of correcting a deformation amount of a bonding stage according to the present invention, it is preferable that the connecting member: restrains movement of the bonding stage relative to the base body in directions along a first axis and a second axis, the first axis being a direction along the surface of the bonding stage, the second axis being a direction along the surface of the bonding stage but perpendicular to the first axis; and allows first twisting of the bonding stage relative to the base body about the first axis, second twisting of the bonding stage relative to the base body about the second axis, and movement of the bonding stage relative to the base body in the vertical direction.

Advantageous Effect of Invention

The present invention provides an effect of providing a flip chip bonder with improved bonding quality and increased bonding speed.

DESCRIPTION OF EMBODIMENTS

Figure 1:
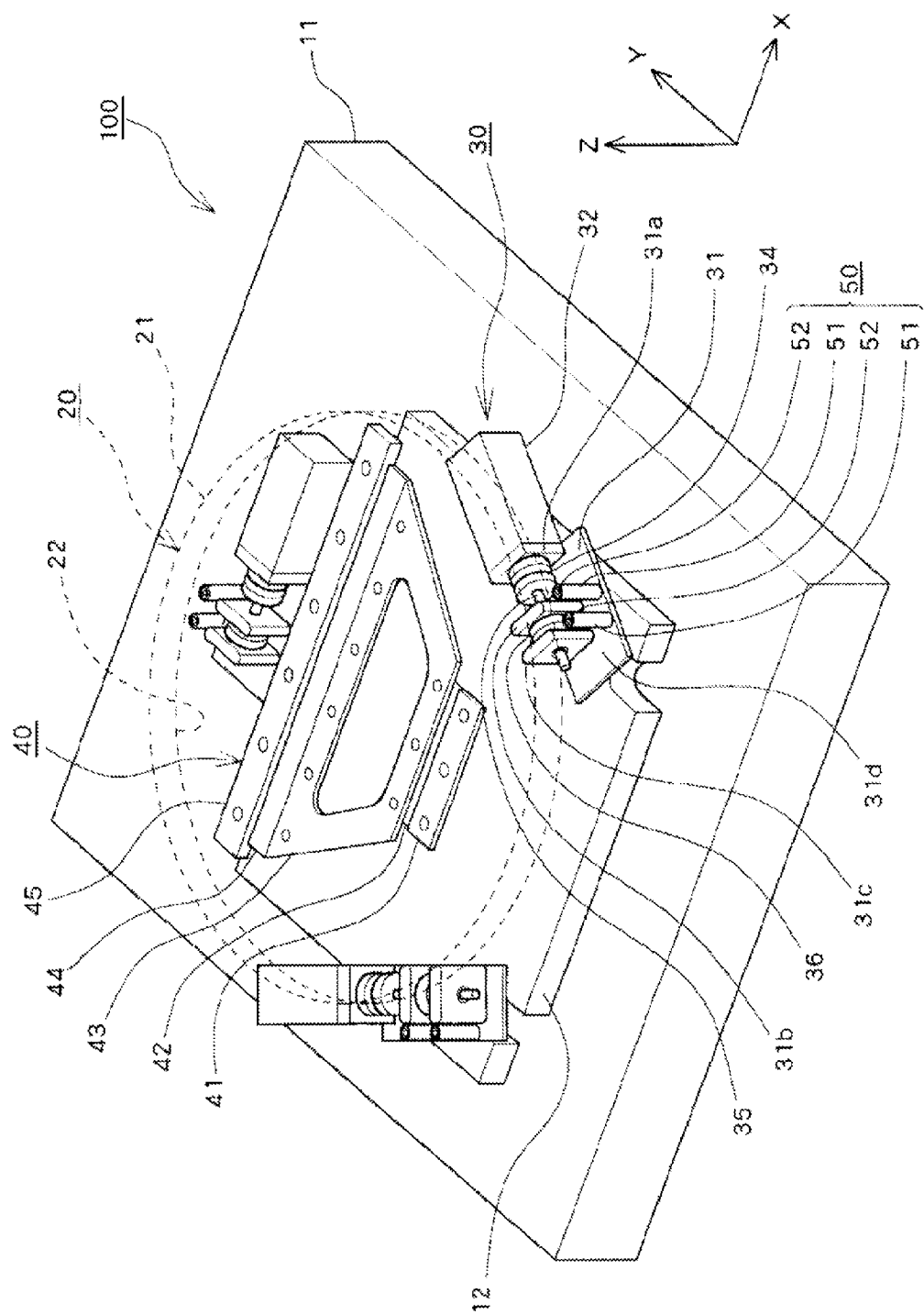
FIG. 1 is a perspective view illustrating a structure of a flip chip bonder of an embodiment according to the present invention.

Hereinafter, an embodiment according to the present invention will be described with reference to the drawings. Referring to FIG. 1, a flip chip bonder 100 according to this embodiment includes: a base 12 which is a base body attached to an upper surface of an XY table 11; a disk-shaped bonding stage 20 for suctioning and fixing a bonding target such as a substrate or a wafer; a plurality of vertical-position adjustment support mechanisms 30 attached to the base 12 and configured to support the bonding stage 20 in a vertical direction as well as to adjust a position of the bonding stage 20 in the vertical direction; a leaf spring mechanism 40 which is a connecting member for connecting the base 12 with the bonding stage 20; and pressurized springs 50 configured to supply pressures for pressing the bonding stage 20 against the vertical-position adjustment support mechanisms 30. FIG. 1 shows the flip chip bonder 100 with the bonding stage 20 removed.

Figure 3:
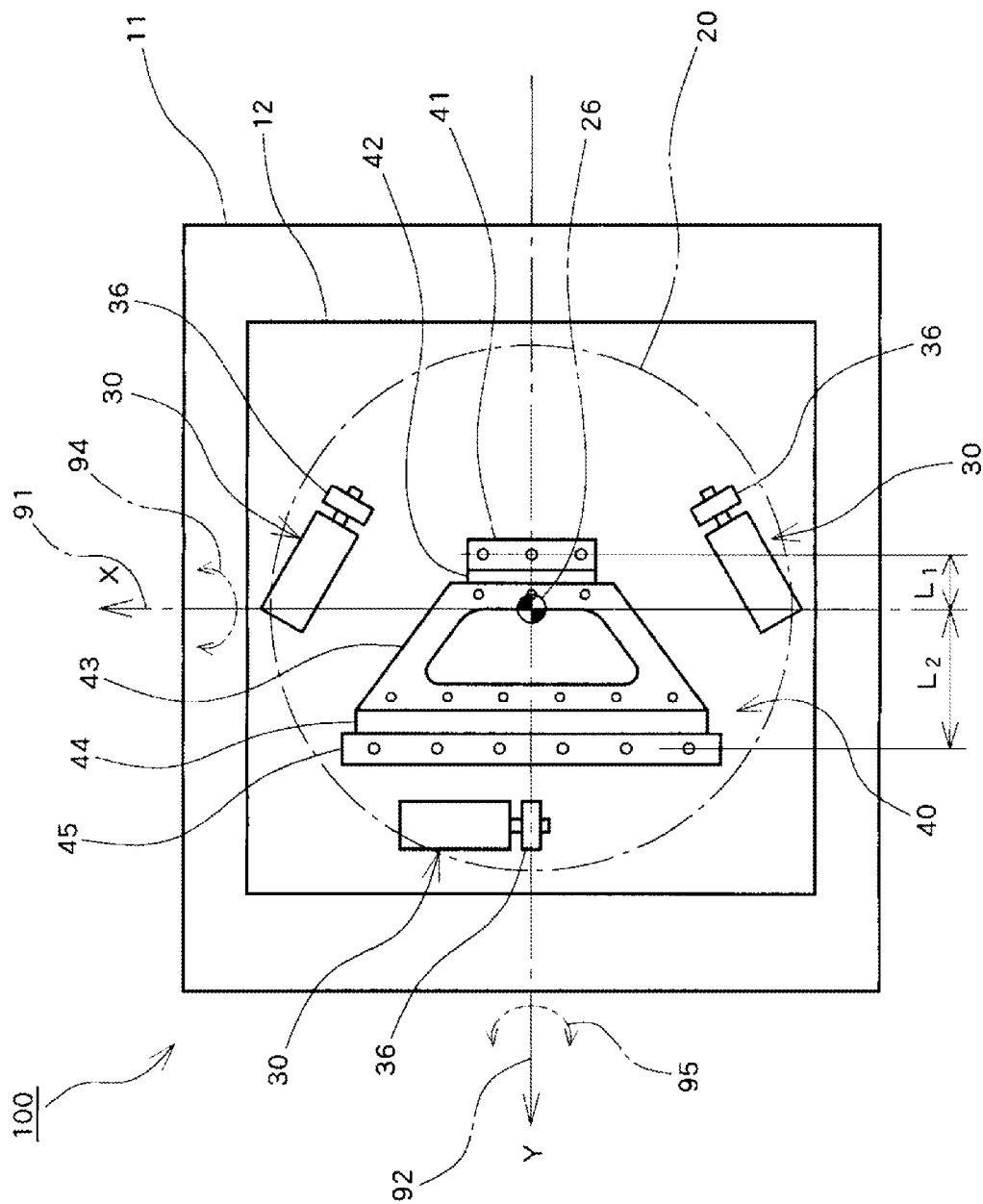
FIG. 3 is a plan view illustrating the structure of the flip chip bonder of the embodiment according to the present invention.
Figure 4:
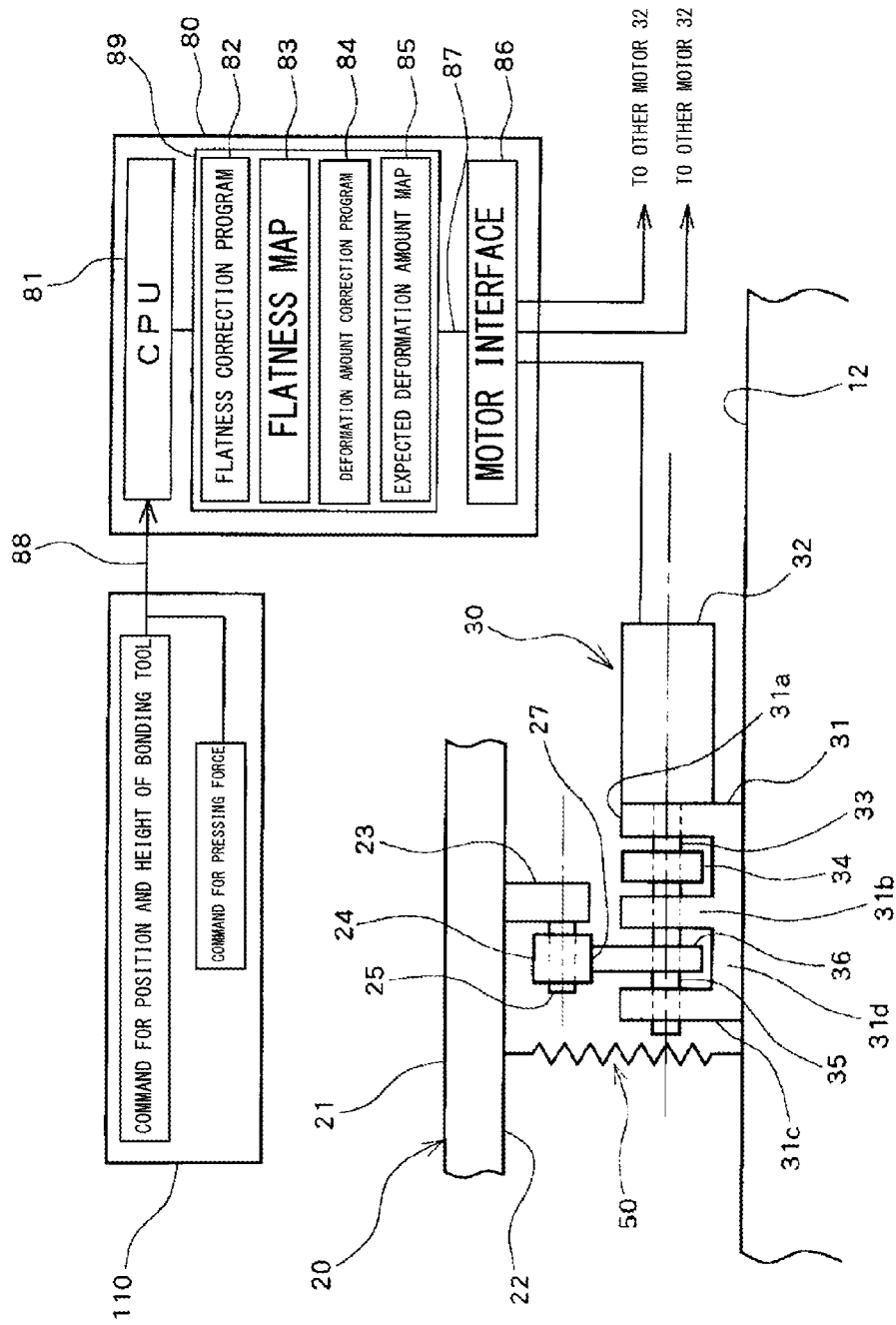
FIG. 4 is an illustrative view showing a structure of a vertical-position adjustment support mechanism and a control system of the flip chip bonder of the embodiment according to the present invention.

As illustrated in FIG. 1 and FIG. 3, the three vertical-position adjustment support mechanisms 30 are arranged so as to support the disk-shaped bonding stage 20 along its outer circumference at intervals of 120°. As illustrated in FIG. 1 and FIG. 4, each of the vertical-position adjustment support mechanisms 30 is configured such that a motor 32 and a cam 36 are attached to a frame 31 fixed to an upper surface of the base 12. The frame 31 is configured by a common flat plate 31d and three brackets 31a, 31b, and 31c projecting from the flat plate 31d. To one vertical surface of the bracket 31a, an end surface of the motor 32 is fixed. A rotational shaft 33 of the motor 32 penetrates the bracket 31a, and protrudes from the other vertical surface of the bracket 31a on a side opposite of the motor 32. In contrast, the brackets 31b and 31c support a rotational shaft 35 of the cam 36. The rotational shaft 35 of the cam 36 penetrates the brackets 31b and 31c, and protrudes toward the motor 32 from a vertical surface of the bracket 31b on a side of the motor 32. Further, an end surface of the rotational shaft 35 of the cam 36 that protrudes from the vertical surface of the bracket 31b on the side of the motor 32 faces against an end surface of the rotational shaft 33 of the motor 32. The end surfaces of the rotational shafts 33 and 35 that face each other are connected via a coupling 34. Therefore, as the motor 32 rotates, the rotational shafts 33 and 35 also rotate, and in turn the cam 36 rotates. Here, the frame 31, the cam 36, and the rotational shaft 35 constitute a cam mechanism.

Figure 2:
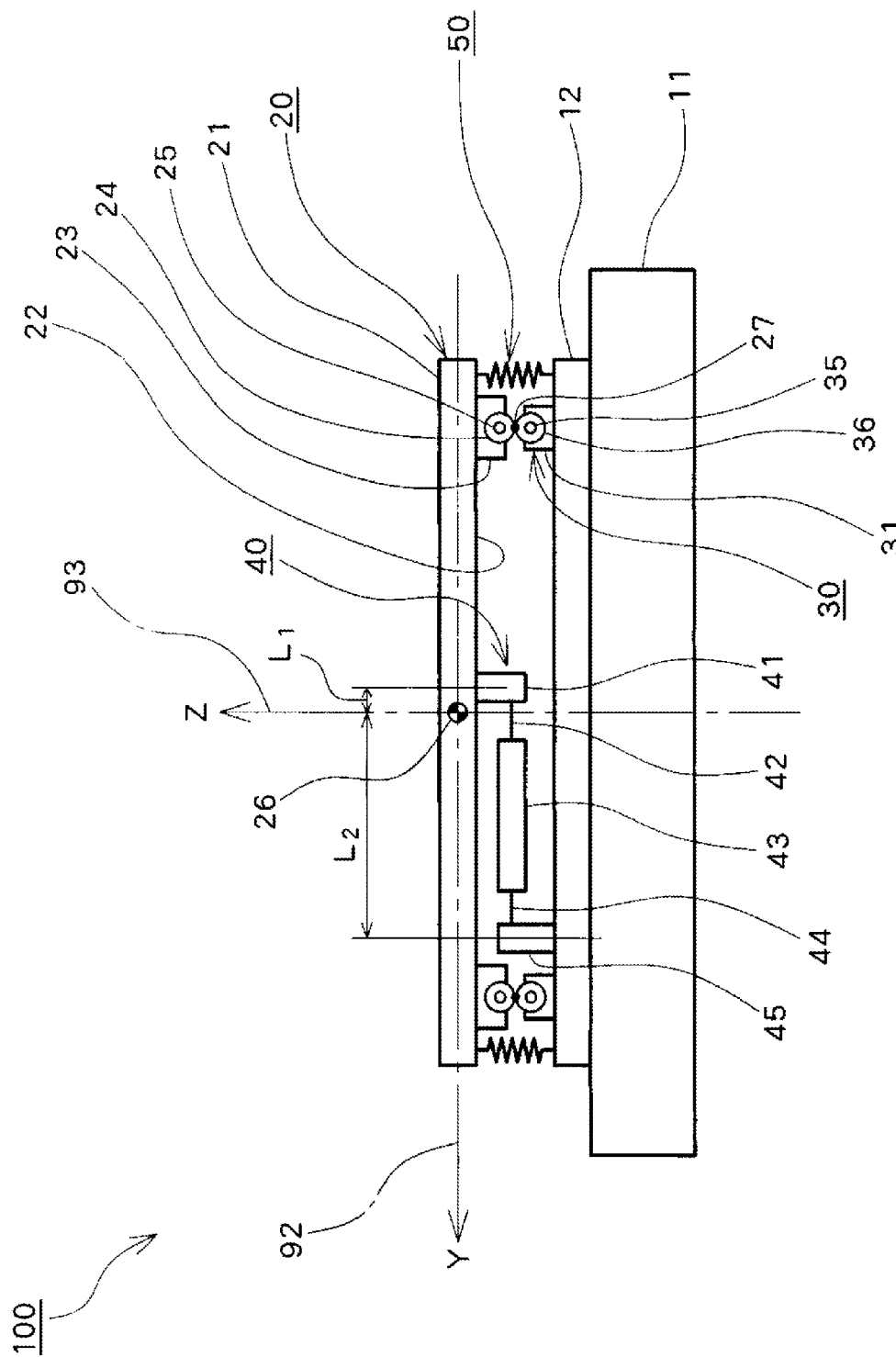
FIG. 2 is a side view illustrating the structure of the flip chip bonder of the embodiment according to the present invention.

In contrast, as illustrated in FIG. 2 and FIG. 4, the bonding stage 20 is provided with brackets 23, pins 25 respectively connected to the brackets 23, and cylindrical cam followers 24 rotatably attached to the pins 25 respectively at three points along its outer circumference at intervals of 120° on a lower surface 22 opposite of a surface 21 for suctioning and fixing a bonding target such as a substrate or a wafer. Contact points 27, each positioned between an upper surface of one of the cams 36 that constitute the vertical-position adjustment support mechanisms 30 and an outer surface of the corresponding cam follower 24, constitute three supporting points for the bonding stage 20. Therefore, the three vertical-position adjustment support mechanisms 30 respectively support the contact points 27 as the three supporting points in the vertical direction. The shape of the cams 36 is configured such that their rotating angle and positions of the respective contact points 27 in the vertical direction (in a Z direction) change linearly, and therefore controlling the rotating angles of the cams 36 allow adjustment of the positions of the contact points 27 in the vertical direction (Z direction). Further, as will be described later, the bonding stage 20 includes a heater, and the bonding stage 20 as a whole is heated during bonding. At this time, as the bonding stage 20 thermally expands outwardly due to the rise of temperatures, the positions of the brackets 23 also move toward the outer circumference of the bonding stage 20. An amount of displacement of the bonding stage 20 due to the thermal expansion is compensated by horizontal movement of the cam followers 24 with respect to the cams 36. Therefore, even though the bonding stage 20 thermally expands, the bonding stage 20 can be supported in the vertical direction by the three vertical-position adjustment support mechanisms 30 at the three contact points 27, or can be positioned such that a surface fixed to the pins 25 and in contact with the cam 36 is flat.

Referring to FIG. 1, the pressurized springs 50 are provided respectively adjacent to the cams 36 of the three vertical-position adjustment support mechanisms 30. Each of the pressurized springs 50 includes: two cylindrical spring cases 51 that are attached to the flat plate 31d of the frame 31 of each of the vertical-position adjustment support mechanisms 30; and coiled springs 52 respectively attached to the spring cases 51. The coiled springs 52 are each configured such that one end of the coiled spring 52 is connected to the bonding stage 20, and pulls the bonding stage 20 to the base 12, so a pressing force acts between the cam follower 24 illustrated in FIG. 2 and FIG. 4 and the cam 36. Here, in FIG. 2 and FIG. 4, the pressurized springs 50 are simply represented by a symbol for spring.

As illustrated in FIG. 1 and FIG. 3, the leaf spring mechanism 40 includes: a first fixation member 41 (first side) which is a rigid band plate fixed to the lower surface 22 of the bonding stage 20; a second fixation member 45 (second side) which is a rigid band plate fixed to the base 12; a substantial-trapezoidal-shaped rigid portion 43 positioned between the first fixation member 41 and the second fixation member 45; a band-shaped first leaf spring 42 which is a first flexible portion connecting the first fixation member 41 and the rigid portion 43; and a band-shaped second leaf spring 44 which is a second flexible portion connecting the second fixation member 45 and the rigid portion 43. In other words, the first leaf spring 42 and the second leaf spring 44 are respectively adjacent to the first fixation member 41 and the second fixation member 45. Further, as illustrated in FIG. 2 and FIG. 3, the first fixation member 41 is shorter than the second fixation member 45. As the length of the first fixation member 41 substantially corresponds to the length of the rigid portion 43 on its side, and the length of the second fixation member 45 substantially corresponds to the length of the rigid portion 43 on its side, the leaf spring mechanism 40 is substantially in a trapezoidal shape as a whole.

As illustrated in FIG. 2 and FIG. 3, the first fixation member 41 and the second fixation member 45 are positioned between the base 12 and the bonding stage 20 such that the first fixation member 41 and the second fixation member 45 are parallel to an X axis 91 as a first axis passing a gravity center 26 of the bonding stage, perpendicular to a Y axis 92 as a second axis passing the gravity center 26 of the bonding stage, and centers of the first fixation member 41 and the second fixation member 45 along the X axis 91 come on the Y axis 92. Further, as illustrated in FIG. 2 and FIG. 3, the first fixation member 41 is fixed to the lower surface 22 of the bonding stage 20 at a position displaced from the gravity center 26 of the bonding stage 20 by a first distance $L_1$ to a negative direction along the Y axis 92, and the second fixation member 45 is fixed to an upper surface of the base 12 at a position displaced from the gravity center 26 by a second distance $L_2$, which is longer than the first distance $L_1$, to a positive direction along the Y axis 92, on a side of the gravity center 26 opposite of the position at which the first fixation member 41 is fixed. An axis shown in FIG. 2 passing the gravity center 26 in the vertical direction corresponds to a Z axis 93.

As described above, the first leaf spring 42 and the second leaf spring 44 are band-shaped leaf springs that are provided respectively between the first fixation member 41 and the rigid portion 43, and between the second fixation member 45 and the rigid portion 43, and respectively adjacent to the first fixation member 41 and the second fixation member 45. Therefore, the first leaf spring 42 and the second leaf spring 44 work as substantially rigid bodies in the direction parallel to the first fixation member 41 and the second fixation member 45, and in the direction perpendicular to the first fixation member 41 and the second fixation member 45, that is, in the directions along the X axis 91 and the Y axis 92. Thus, relative movement of the base 12 and the bonding stage 20 is restrained in the directions of the X axis 91 and the Y axis 92.

Figure 5A:
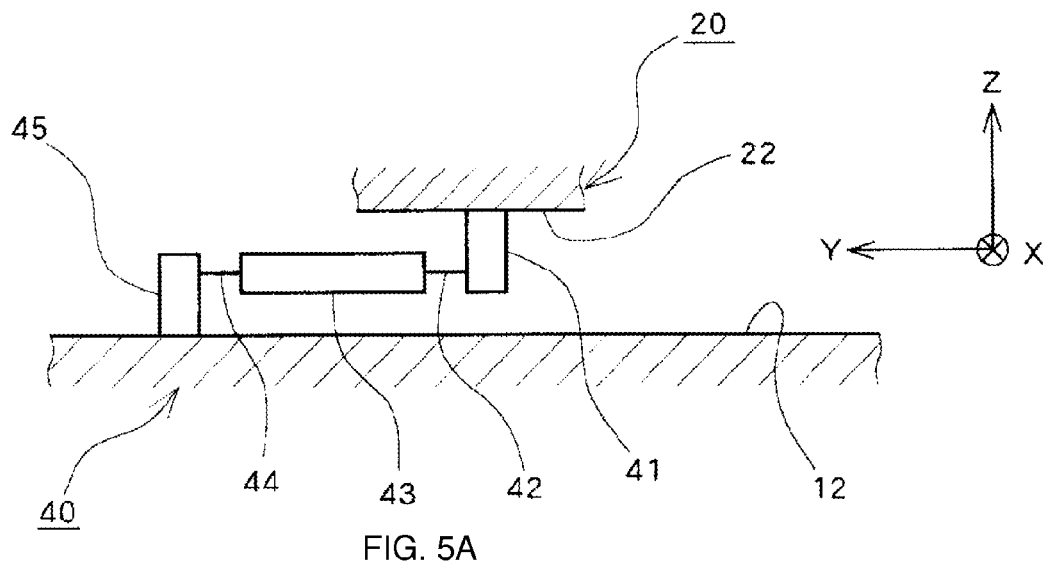
FIGS. 5($a$) and 5$b$ are illustrative views showing an operation of a connecting member (leaf spring mechanism) of the flip chip bonder of the embodiment according to the present invention.
Figure 5B:
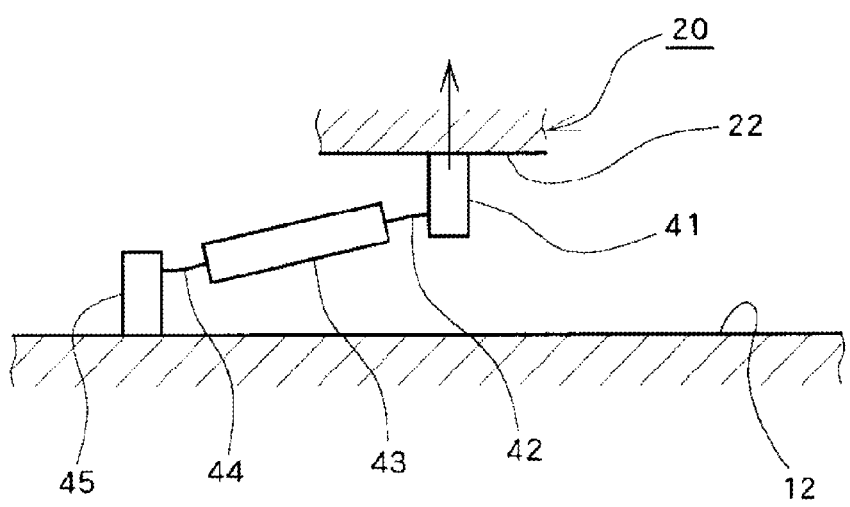

In contrast, as illustrated in FIG. 5, the first leaf spring 42 and the second leaf spring 44 are thin and easily flex in the thickness direction. As the bonding stage 20 in a state shown in FIG. 5(a) moves in the vertical direction (Z direction) as illustrated in FIG. 5b, the first leaf spring 42 and the second leaf spring 44 deform and bend in the thickness direction, i.e., about the X axis, act so that the first fixation member 41 and the second fixation member 45 constitute a parallel link, and allow relative movement between the base 12 and the bonding stage 20 in the vertical direction (Z direction). Similarly, bending of the first leaf spring 42 and the second leaf spring 44 about the X axis allows twisting 94 (first twisting) between the base 12 and the bonding stage 20 about the X axis 91 shown in FIG. 3. Further, the first leaf spring 42 of the leaf spring mechanism 40 is short, and therefore allows twisting 95 (second twisting) between the first fixation member 41 and the rigid portion 43 about the Y axis 92. Specifically, the leaf spring mechanism 40 restrains movement of the bonding stage 20 relative to the base 12 both in the directions along the X axis 91 and the Y axis 92. Further, the leaf spring mechanism 40 allows the twisting 94 (first twisting) about the X axis 91 and twisting 95 (second twisting) about the Y axis 92 of the bonding stage 20 relative to the base 12, as well as movement of the bonding stage 20 relative to the base 12 in the vertical direction (Z direction).

As the bonding stage 20 is pressed against the cams 36 of the three vertical-position adjustment support mechanisms 30 by the pressurized springs 50, the position of the bonding stage 20 in the vertical direction, an inclination about the X axis 91, and an inclination about the Y axis 92 are adjusted by the three vertical-position adjustment support mechanisms 30. Further, as the bonding stage 20 is connected to the base 12 by the leaf spring mechanism 40 that is highly rigid in the XY directions, using the flexible first leaf spring 42 and the flexible second leaf spring 44, instead of connecting means possibly including backlash such as a link, it is possible to restrain the bonding stage 20 from moving or vibrating in the vertical direction or in the XY directions during high speed bonding. Thus, the bonding stage 20 can be effectively utilized in high speed bonding.

In the embodiment described above, the first fixation member 41 and the second fixation member 45 are arranged so as to be parallel to the X axis 91 and perpendicular to the Y axis 92. However, the first fixation member 41 and the second fixation member 45 can be arranged so as to be parallel to the Y axis 92 and perpendicular to the X axis 91. Further, the X axis 91 and the Y axis 92 are not necessarily required to be perpendicular to and along a transfer direction of a substrate of the flip chip bonder 100, as long as the X axis 91 and the Y axis 92 are perpendicular to each other along the surface 21 of the bonding stage 20.

Figure 6A:
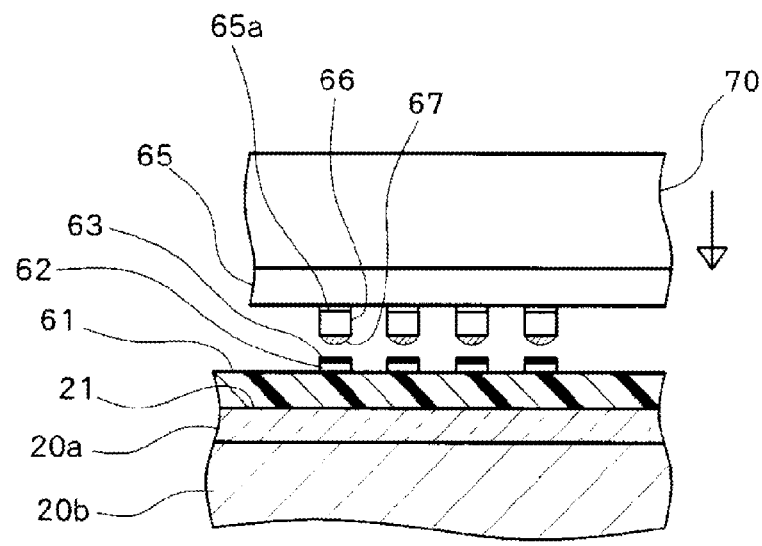
FIGS. 6a and 6b are sectional views illustrating a structure of a bonding stage of the flip chip bonder of the embodiment according to the present invention.

A configuration of the bonding stage 20 according to this embodiment is illustrated in FIG. 6. Referring to FIG. 6a, the bonding stage 20 according to this embodiment for example includes: a first layer 20a having low thermal conductivity, such as ceramic; a second layer 20b having thermal conductivity higher than that of the first layer 20a, having a thermal expansion rate substantially the same as that of the first layer 20a, and configured by a material such as austenite-based stainless steel; a third layer 20c configured by a material similar to that of the second layer 20b; and a heater 28 held between the second layer 20b and the third layer 20c. In the bonding stage 20 according to this embodiment, as the first layer 20a, the second layer 20b, and the third layer 20c are configured by stacking materials of a similar thermal expansion rate, it is possible to restrain deformation of the bonding stage 20 such as warpage due to heat even when the bonding stage 20 is heated by the heater 28, and to provide an effect of ensuring flatness of the surface 21 of the bonding stage 20.

Figure 6B:
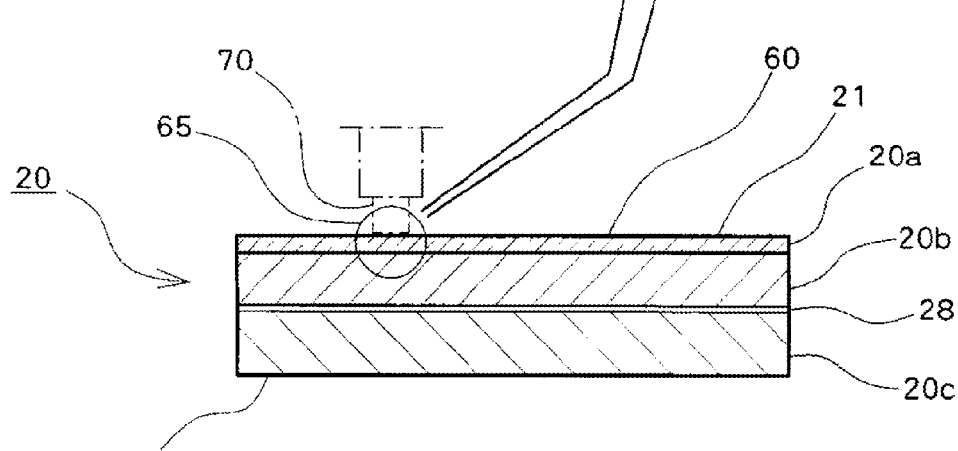

During bonding, the bonding stage 20 as a whole is heated by the heater 28 up to a predetermined temperature. Then, as illustrated in FIG. 6b, a position of an electrode 62 provided for a substrate 61 suctioned and fixed onto the surface 21 of the bonding stage 20 is aligned with a position of a pillar 66 formed on an electrode 65a of a chip 65 suctioned to a bonding tool 70, the pillar 66 is pressed against the electrode 62 of the substrate 61 while heating the chip 65 by the bonding tool 70, a solder film 67 formed at a tip of the pillar 66 is molten, a plating layer 63 at a tip of the electrode 62 of the substrate 61 is welded to the pillar 66 by solder, and the chip 65 is mounted on the substrate 61. At this time, thermal conductivity of the first layer 20a of the bonding stage 20 on the side of the surface 21 is low, and heat is not easily transmitted in the horizontal direction. Therefore, the chip 65 adjacent to another chip 65 to which bonding is performed is less likely heated by heating of the bonding tool 70. Thus, it is possible to effectively restrain the chip 65 in an adjacent area to which bonding has been performed from being heated, as well as to effectively restrain solder of the chip 65 to which bonding has been performed from becoming molten again.

A system for controlling the three vertical-position adjustment support mechanisms 30 of the flip chip bonder 100 having the above described structure will be now described. Referring to FIG. 4, the motor 32 of each of the three vertical-position adjustment support mechanisms 30 is connected to a control unit 80, and a rotating angle is controlled based on a command of the control unit 80. The control unit 80 is a computer containing a CPU 81, as well as a motor interface 86 for receiving and transmitting a control signal between a storage unit 89 and the motor 32. The storage unit 89 stores a flatness correction program 82, a flatness map 83, a deformation amount correction program 84, and an expected deformation amount map 85, all of which will be described later. The CPU 81, the storage unit 89, and the motor interface 86 are connected by a data bus 87. Further, to the CPU 81, a command signal for a position of the bonding tool in the XY directions and a position of the bonding tool in the Z direction (height) and a command signal for a pressing force of the bonding tool are input from a main control unit 110 that controls a bonding operation of the flip chip bonder 100 via a data link 88.

Figure 7A:
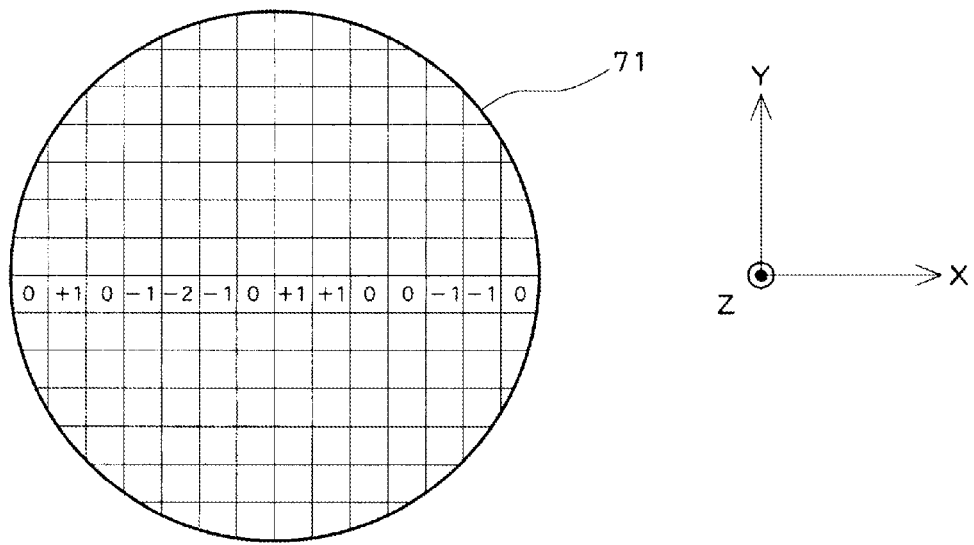
FIGS. 7a and 7b are illustrative views showing the bonding stage of the flip chip bonder and a flatness map of the bonding stage, of the embodiment according to the present invention.
Figure 7B:
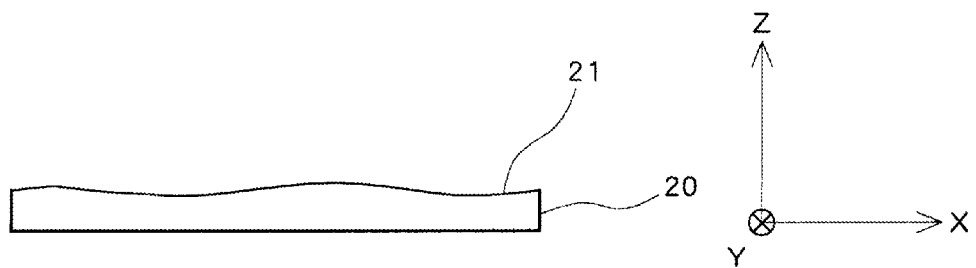

The flatness map 83 shows waves on the surface 21 as shown in FIG. 7b obtained, for example, by dividing the surface 21 of the bonding stage 20 into small sections 71 in a grid as shown in FIG. 7a, and by standardizing a height of each of the sections 71, so that its absolute value becomes greater as its difference from a reference value becomes greater, where the reference height is 0 and the height takes a negative value when smaller than the reference height and a higher value when greater than the reference height. The flatness map 83 stored in the storage unit 89 illustrated in FIG. 4 is a table of XY positions of the sections 71 and their standardized height (positions in the Z direction), as well as inclination angles and inclination directions of the surfaces of the sections 71, as illustrated in FIG. 7a and FIG. 7b.

Figure 10A:
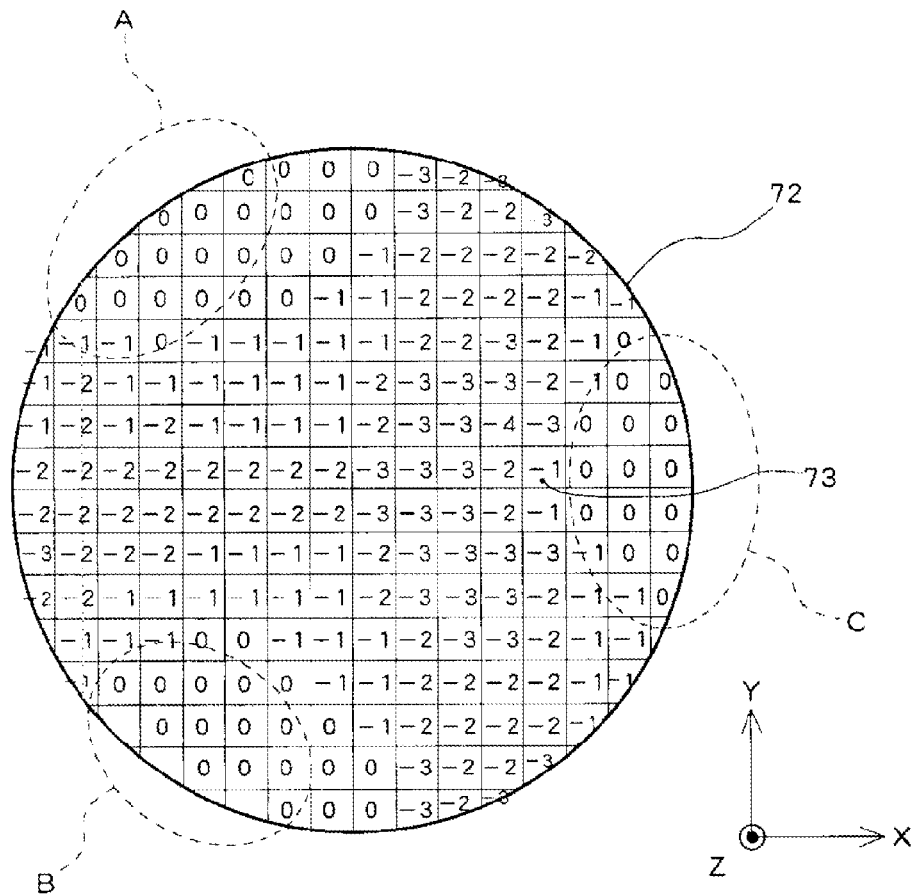
FIGS. 10a and 10b are illustrative views showing the bonding stage of the flip chip bonder and an expected deformation amount map of the bonding stage, of the embodiment according to the present invention.
Figure 10B:
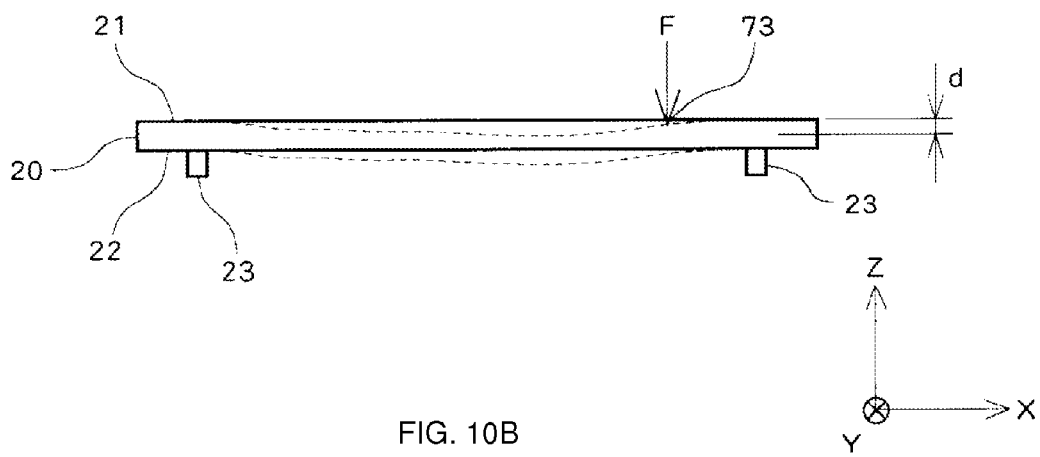

Further, the expected deformation amount map 85 is a table of standardized values of a reference deflection amount $d_0$ as an expected deformation amount occurring to a section 73 among small sections 72 in a grid into which the surface 21 of the bonding stage 20 is divided as shown in FIG. 10a, when a reference pressing force $F_0$ is applied to the certain section 73 as illustrated in FIG. 10a and FIG. 10b. Therefore, the table records the reference deflection amount $d_0$ for each section 73 that is to be pressed. For example, when the number of the sections is 100, the expected deformation amount map 85 includes 100 data pieces. As illustrated in FIG. 10a, for example, the reference deflection amount $d_0$ as the expected deformation amount is 0 as the bonding stage 20 can not be deflected even when a pressing force F is applied in regions around the brackets 23, shown in FIG. 2, supported by the three vertical-position adjustment support mechanisms 30 are provided (regions A, B, and C indicated by dashed lines in FIG. 10a), but the reference deflection amount $d_0$ increases in a central portion and portions between the regions A, B, and C as illustrated in FIG. 10a as the bonding stage 20 is deflected due to the reference pressing force $F_0$.

Next, an operation, of the flip chip bonder 100 thus configured, for adjusting an inclination of the surface of the bonding stage 20 as a whole will be described. The height of the surface 21 of the bonding stage 20 is measured, for example, by moving a tip of the bonding tool 70 illustrated in FIG. 6a down so as to be brought into contact with the surface 21 of the bonding stage 20, and detecting a height of the tip of the bonding tool 70 at which the bonding tool 70 is brought into contact with the surface 21 of the bonding stage 20. The measurement is performed at any three different points on the surface 21, for example, at three points near the outer circumference along its circumference positioned at intervals of 120°. Then, an inclination of the surface 21 of the bonding stage 20 with respect to the horizontal plane is calculated based on the measured height at the three points on the surface 21 of the bonding stage 20, and the three vertical-position adjustment support mechanisms 30 are operated based on the result of calculation to adjust the inclination of the surface 21 of the bonding stage 20. This operation can be manually performed, or can be automatically performed by causing the control unit 80 and the main control unit 110 of the flip chip bonder 100 to work in conjunction.

Figure 8:
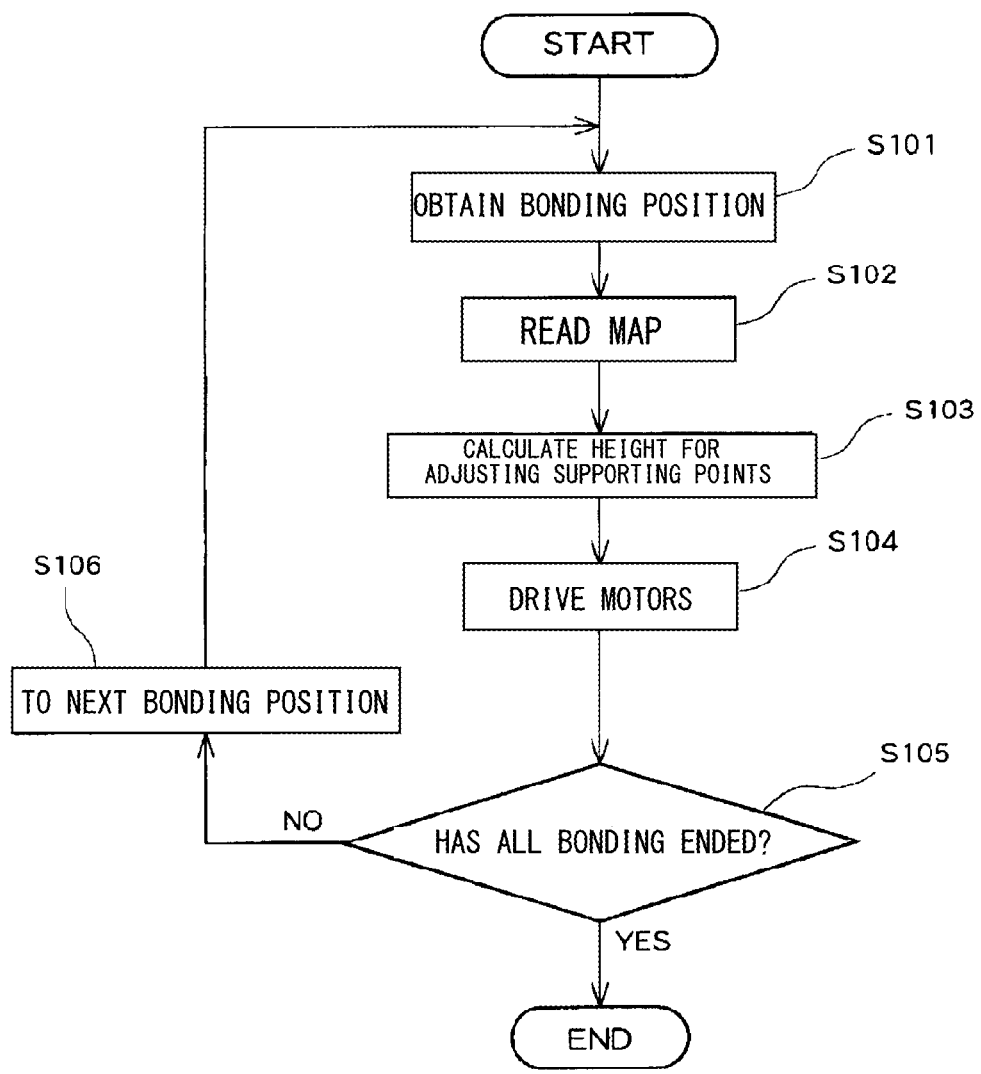
FIG. 8 is a flowchart showing an operation of correcting flatness of the bonding stage of the flip chip bonder of the embodiment according to the present invention.

Next, as illustrated in FIG. 7b, when flatness of the surface 21 is not in a good condition as there are waves on the surface 21 of the bonding stage 20 as illustrated in FIG. 8, bonding is performed after executing the flatness correction program 82. First, as shown by Step S101 in FIG. 8, the CPU 81 of the control unit 80 obtains a command signal for the position in the XY directions and the height in the Z direction of the bonding tool 70 illustrated in FIG. 6, from the main control unit 110 of the flip chip bonder 100 via the data link 88, and specifies one of the sections 71 to which bonding is to be performed. As shown by Step S102 in FIG. 8, the CPU 81 reads the reference deflection amount $d_0$ for the reference pressing force $F_0$ of the specified section 71 from the flatness map 83. Then, the CPU 81 of the control unit 80 calculates rotating angles of the motors 32 of the three vertical-position adjustment support mechanisms 30 required for making the surface at the specified sections 71 horizontal as shown by Step S103 in FIG. 8, rotates the motors 32 by the calculated rotating angles as shown by Step S104 in FIG. 8, and adjusts such that the surface 21 at the sections 71 to which bonding is to be performed is parallel to the horizontal plane. Subsequently, as shown by Step S105 in FIG. 8, the control unit 80 determines whether or not bonding to all bonding positions has ended, and if bonding to all bonding positions has not ended, the control unit 80 moves the bonding tool 70 to a position for next bonding as shown by Step S106 in FIG. 8. The process then returns to Step S101 in FIG. 8, and the control unit 80 moves the bonding tool 70 to the position for next bonding in the same manner as described above, and rotates the motors 32 of the three vertical-position adjustment support mechanisms 30 while referring to the flatness map 83, so that the surface at the sections 71 at this position becomes horizontal.

As described above, by performing bonding using the flatness map 83 and the flatness correction program 82, even though there are waves over the surface 21 of the bonding stage 20 as illustrated in FIG. 7b, the plurality of pillars 66 of the chip 65 illustrated in FIG. 6b can be brought into contact with the plurality of electrodes 62 of the substrate 61 substantially at the same time, similarly to the bonding stage 20 with high flatness, by making the surface at the sections 71 parallel to the horizontal plane. Therefore, it is possible to restrain a part of the plurality of pillars 66 from being brought into contact with the plurality of electrodes 62, and to improve bonding quality.

Next, when bonding is performed using the expected deformation amount map 85 to execute the deformation amount correction program 84 will be described. First, as shown by Step S201 in FIG. 9, the CPU 81 of the control unit 80 obtains a command signal for the position in the XY directions and a height H in the Z direction of the bonding tool 70 illustrated in FIG. 6, from the main control unit 110 of the flip chip bonder 100 via the data link 88, and specifies the section 73 to which bonding is to be performed. Then, as shown by Step S202 in FIG. 9, the CPU 81 reads data for the height and the inclination angle and the inclination direction of the surface of the specified section 73 from the expected deformation amount map 85. Subsequently, as shown by Step S203 in FIG. 9, the control unit 80 obtains a command value of the pressing force F from the main control unit 110 of the flip chip bonder 100 via the data link 88. In contrast, during a period from time $t_0$ to time $t_1$ in FIG. 11a, the main control unit 110 of the flip chip bonder 100 decreases the command value of the height H of the bonding tool 70 toward the specified section 73 as indicated by a line a in FIG. 11a, and moves the bonding tool 70 downward. Then, at time $t_1$, the chip 65 suctioned to the tip of the bonding tool 70 illustrated in FIG. 6b is brought into contact with the substrate 61. At this time point, the command value of the pressing force F output from the main control unit 110 is zero. Further, at time $t_2$, the main control unit 110 increases the command value of the pressing force F from zero, and presses the pillars 66 of the chip 65 against the electrodes 62 of the substrate 61. The CPU 81 of the control unit 80 obtains the command value of the pressing force F via the data link 88. Further, as shown by Step S204 in FIG. 9, the CPU 81 compares the command value of the pressing force F with the reference pressing force $F_0$, and calculates an expected deflection amount $d_1$ by multiplying the reference deflection amount $d_0$ by a proportion of the command value of the pressing force F to the reference pressing force $F_0$ assuming that the specified section 73 deflects according to this proportion. Then, the CPU 81 calculates rotating angles of the motors 32 of the three vertical-position adjustment support mechanisms 30 required for correcting the expected deflection amount $d_1$. Thereafter, as shown by Step S205 in FIG. 9, the control unit 80 rotates the motors 32 by the respective calculated angles, and moves the surface 21 of the bonding stage 20 up by the expected deflection amount $d_1$ of the section 73. With this, the surface 21 is maintained at a predetermined height even when the pressing force F is applied. At this time, a deflection correction amount $e_1$ shown in FIG. 11b to be corrected by the vertical-position adjustment support mechanisms 30 is a value of the same absolute value as the expected deflection amount $d_1$ but in an opposite direction.

Figure 9:
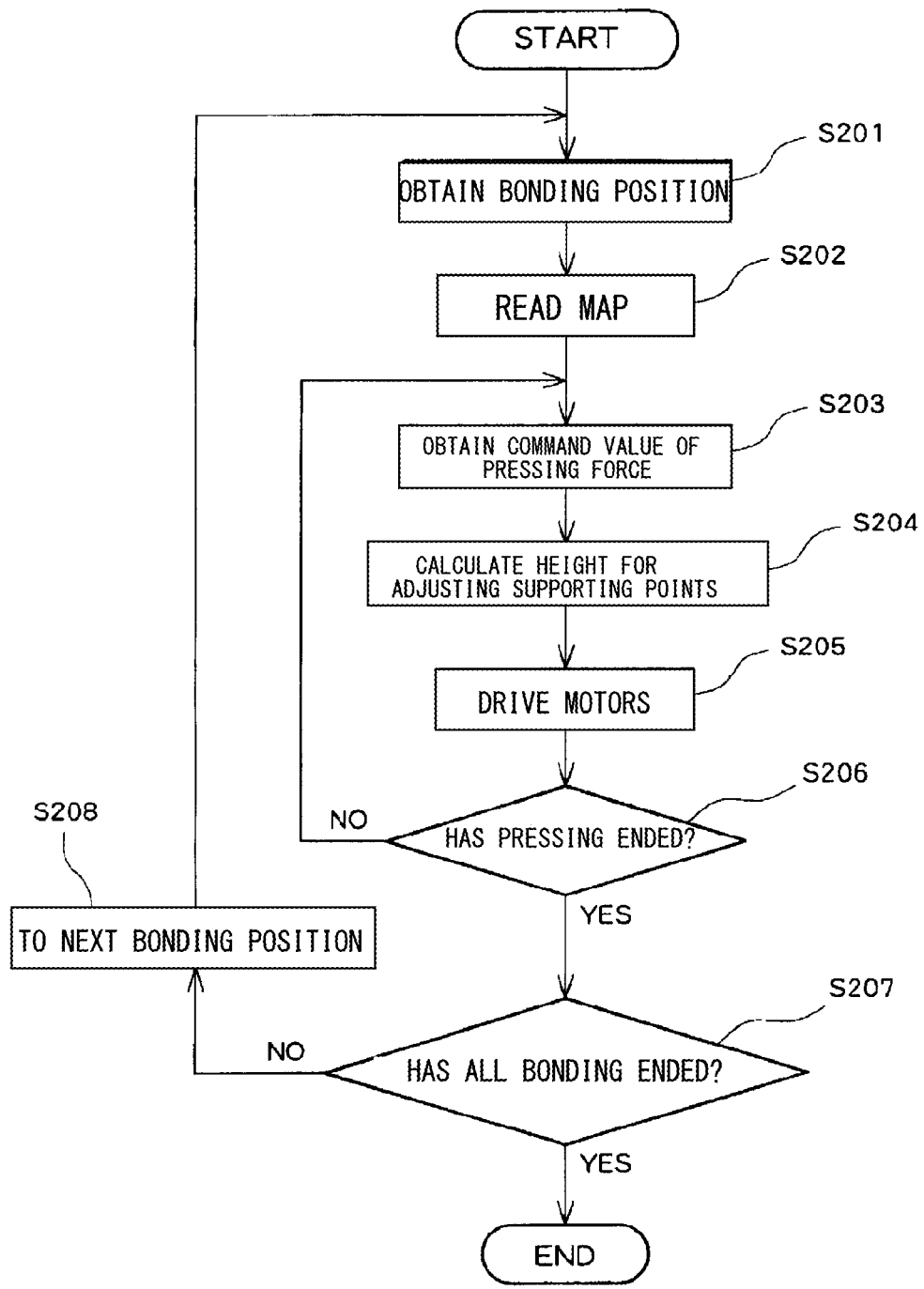
FIG. 9 is a flowchart showing an operation of correcting a deformation amount of the bonding stage of the flip chip bonder of the embodiment according to the present invention.

As shown by Step S206 in FIG. 9, upon completion of correction of the expected deflection amount $d_1$, the control unit 80 determines whether or not the pressing by the bonding tool 70 has ended. The control unit 80 determines the pressing has not ended unless the command value of the pressing force F obtained from the main control unit 110 via the data link 88 is zero. In this case, the process returns to Step S203 in FIG. 9, and the control unit 80 again obtains the command value of the pressing force F from the main control unit 110 via the data link 88, and as shown by Steps S204-S205 in FIG. 9, calculates the expected deflection amount $d_1$ according to the command value of the pressing force F, and rotates the motors 32 to correct the expected deflection amount $d_1$. As the pressing force F increases during a period from time $t_2$ to time $t_3$ as indicated by an alternate long and short dash line b in FIG. 11a, the deflection correction amount $e_1$ also increases as indicated by a line c in FIG. 11b. Then, when the command value of the pressing force F reaches a certain specific value, such as 500 N, at time $t_3$ in FIG. 11a, the deflection correction amount $e_1$ also reaches a certain specific value as indicated by the line c in FIG. 11b. Thereafter, until the command value of the pressing force F becomes zero (until the pressing ends), the control unit 80 repeats Steps S203-S206 in FIG. 9, and controls to change the expected deflection amount $d_1$ and the deflection correction amount $e_1$ according to the change of the command value of the pressing force F, to adjust the rotating angles of the motors 32 and to maintain the height of the surface at the section 73.

At time $t_3$, the main control unit 110 turns the heater 28 built within the bonding tool 70 illustrated in FIG. 6 on to melt the solder films 67 at the tips of the pillars 66 of the chip 65, and joins the pillars 66 with the plating layers 63 on the surfaces of the electrodes 62 of the substrate 61 by the molten solder. Then, the main control unit 110 stops pressing and heating at time $t_4$ in FIG. 11a, decreases the pressing force F as indicated by the alternate long and short dash line b in FIG. 11a. When the command value of the pressing force obtained from the main control unit 110 becomes zero at time $t_5$, the control unit 80 determines in Step S206 in FIG. 9 that the pressing has ended, and determines whether or not all bonding has ended as shown by Step S207 in FIG. 9. If all bonding has not ended, the control unit 80 moves to a position for next bonding as shown by Step S208 in FIG. 9.

Figures 11A, 11B:
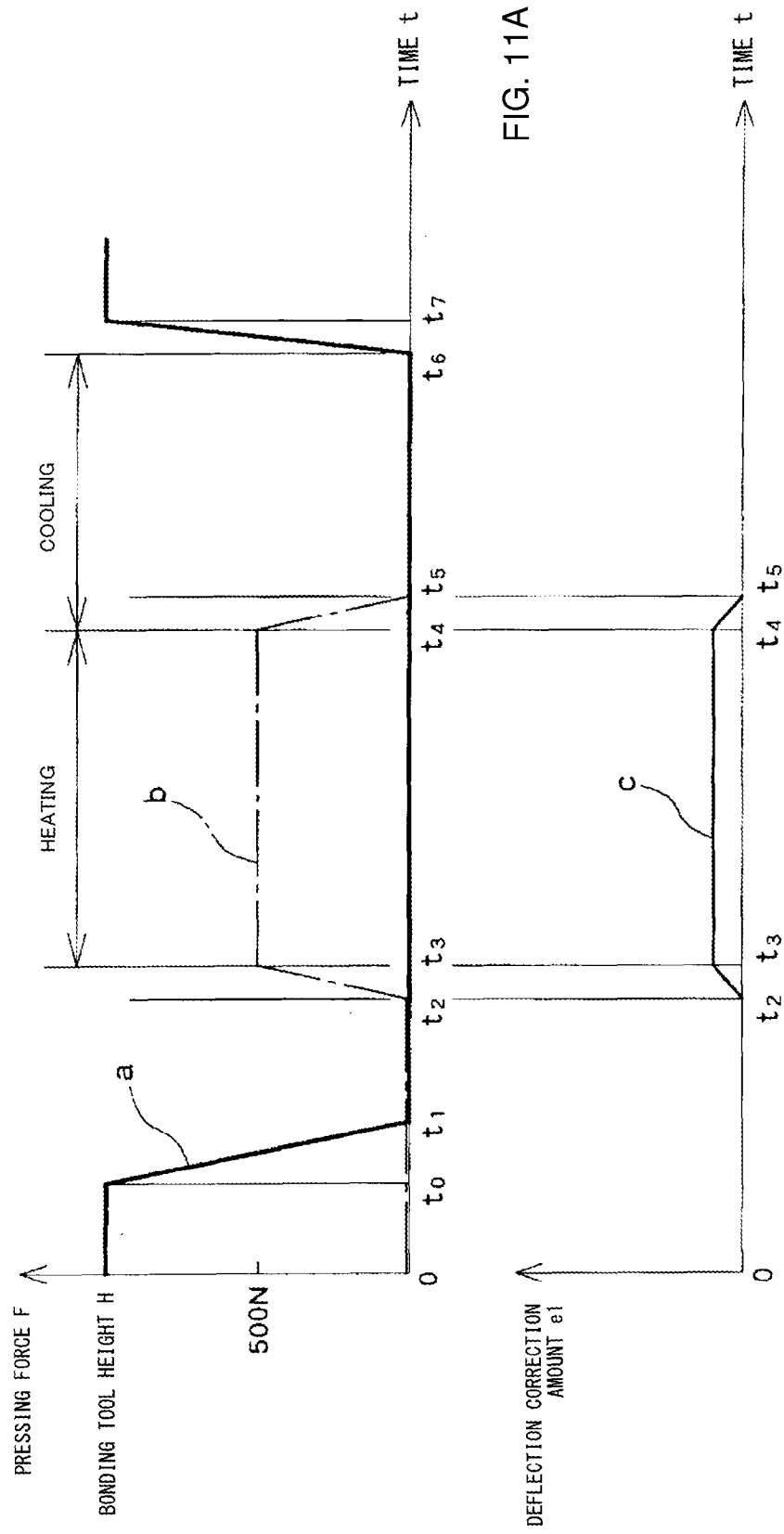
FIGS. 11a and 11b are charts showing changes in a pressing force F, a bonding tool height H, and an amount of adjustment of a height and an inclination of the bonding stage during bonding by the flip chip bonder of the embodiment according to the present invention.

In contrast, the main control unit 110 starts to decrease the command value of the pressing force F at time $t_4$ in FIG. 11a, and turns the heater 28 built within the bonding tool 70 illustrated in illustrated in FIG. 6 off to cool and harden the molten solder films 67, and joins the pillars 66 with the plating layers 63. Then, when the solder is hardened completely at time $t_6$ in FIG. 11a, the main control unit 110 moves the bonding tool 70 illustrated in FIG. 6 upward to a position for next bonding.

As described above, by performing bonding is performed by using the expected deformation amount map 85 and executing the deformation amount correction program 84, even though the pressing force F is applied during bonding using the bonding stage 20 with low rigidity in which deformation (deflection) can occur due to the pressing force F, it is possible to perform bonding in a condition similar to a condition in which deformation does not occur. Therefore, similarly to the bonding stage 20 with high rigidity, the plurality of pillars 66 of the chip 65 illustrated in FIG. 6b can be brought into contact with the plurality of electrodes 62 of the substrate 61 substantially at the same time. Thus, it is possible to restrain a part of the plurality of pillars 66 from being brought into contact with the plurality of electrodes 62, and to improve bonding quality.

In the embodiment described above, it is described that the expected deformation amount map 85 is a table of the reference deflection amount $d_0$ when the reference pressing force $F_0$ is applied to each of the sections 73. However, it is possible to store data for a reference amount for an inclination in addition to the reference deflection amount $d_0$, and to correct the inclination along with the deflection amount. Further, while it is described that the bonding stage 20 is supported by the three vertical-position adjustment support mechanisms 30 in the embodiment described above, the bonding stage 20 may be supported by four or more vertical-position adjustment support mechanisms 30. Moreover, the shape of the bonding stage 20 is not limited to the disk shape, and may be a shape in a square flat plate.

The present invention is not limited to the embodiment described above, and includes any alterations and modifications without departing from the technical scope and the spirit of the present invention as defined in the appended claims.

REFERENCE SIGNS LIST

11: XY Table
12: Base
20: Bonding Stage
20a: First Layer
20b: Second Layer
20c: Third Layer
21: Surface
22: Lower Surface
23: Bracket 24: Cam Follower
25: Pin
26: Gravity Center
27: Contact Point
28: Heater
30: Vertical-Position Adjustment Support Mechanism
31: Frame
31a, 31b, 31c: Bracket
31d: Flat Plate
32: Motor
33, 35: Rotational Shaft
34: Coupling
36: Cam
40: Leaf Spring Mechanism
41: First Fixation Member
42: First Leaf Spring
43: Rigid Portion
44: Second Leaf Spring
45: Second Fixation Member
50: Pressurized Spring
51: Spring Case
52: Coiled Spring
61: Substrate
62: Electrode
63: Plating Layer
65: Chip
65a, 66: Electrode
66: Pillar
67: Solder Film
70: Bonding Tool
71, 72, 73: Section
80: Control Unit
81: CPU
82: Flatness Correction Program
83: Flatness Map
84: Deformation Amount Correction Program
85: Expected Deformation Amount Map
86: Motor Interface
87: Data Bus
88: Data Link
89: Storage Unit
91: X Axis
92: Y Axis
93: Z Axis
94: Twisting About X Axis
95: Twisting About Y Axis
100: Flip Chip Bonder
110: Main Control Unit
$d_0$: Reference Deflection Amount
$d_1$: Expected Deflection Amount
$e_1$: Deflection Correction Amount
F: Pressing Force
$F_0$: Reference Pressing Force
$L_1$: First Distance
$L_2$: Second Distance

The invention claimed is:

1. A flip chip bonder, comprising:
a base body;
a bonding stage for suctioning and fixing a bonding target;
a plurality of vertical-position adjustment support mechanisms attached to the base body, and respectively configured to support the bonding stage at a plurality of supporting points in a vertical direction, and to adjust positions of the respective supporting points in the vertical direction, the supporting points being provided on a side opposite of a surface for suctioning and fixing the bonding target of the bonding stage; and
a connecting member configured to connect the base body with the bonding stage, wherein
the connecting member:
restrains movement of the bonding stage relative to the base body in directions along a first axis and a second axis, the first axis being a direction along the surface of the bonding stage, the second axis being a direction along the surface of the bonding stage but perpendicular to the first axis; and
allows first twisting of the bonding stage relative to the base body about the first axis, second twisting of the bonding stage relative to the base body about the second axis, and movement of the bonding stage relative to the base body in the vertical direction.

2. The flip chip bonder according to claim 1, wherein
the connecting member is configured as a leaf spring mechanism substantially in a trapezoidal shape having a first side and a second side parallel to each other, the leaf spring mechanism comprising a first flexible portion adjacent to and extending along the first side, a second flexible portion adjacent to and extending along the second side, and a rigid portion between the first flexible portion and the second flexible portion, and
the connecting member is disposed between the base body and the bonding stage such that the first side and the second side are parallel to one of the first axis and the second axis.

3. The flip chip bonder according to claim 2, wherein
the first side of the leaf spring mechanism is shorter than the second side,
the first side of the leaf spring mechanism is attached to a first position on the side opposite of the surface of the bonding stage, the first position being displaced by a first distance from a gravity center of the bonding stage, and
the second side of the leaf spring mechanism is attached to a second position on the base body on a surface facing the bonding stage, the second position being provided on a side opposite of the first position across the gravity center and displaced by a second distance from the gravity center, the second distance being longer than the first distance.

4. The flip chip bonder according to claim 1, further comprising:
a plurality of pressurized springs configured to respectively press the supporting points of the bonding stage onto the corresponding vertical-position adjustment support mechanisms, wherein
each of the vertical-position adjustment support mechanisms comprises a cam mechanism in contact with the corresponding supporting point.

5. The flip chip bonder according to claim 2, wherein
a plurality of pressurized springs configured to respectively press the supporting points of the bonding stage onto the corresponding vertical-position adjustment support mechanisms, wherein
each of the vertical-position adjustment support mechanisms comprises a cam mechanism in contact with the corresponding supporting point.

6. The flip chip bonder according to claim 3, wherein
a plurality of pressurized springs configured to respectively press the supporting points of the bonding stage onto the corresponding vertical-position adjustment support mechanisms, wherein
each of the vertical-position adjustment support mechanisms comprises a cam mechanism in contact with the corresponding supporting point.

7. The flip chip bonder according to claim 1, further comprising:
a control unit configured to operate the vertical-position adjustment support mechanisms, wherein
the control unit comprises:
a flatness map indicating flatness of each of sections on the bonding stage; and
a flatness correction unit configured to correct a height and an inclination of the bonding stage based on the flatness map according to a position of bonding.

8. The flip chip bonder according to claim 2, wherein
a control unit configured to operate the vertical-position adjustment support mechanisms, wherein
the control unit comprises:
a flatness map indicating flatness of each of sections on the bonding stage; and
a flatness correction unit configured to correct a height and an inclination of the bonding stage based on the flatness map according to a position of bonding.

9. The flip chip bonder according to claim 3, wherein
a control unit configured to operate the vertical-position adjustment support mechanisms, wherein
the control unit comprises:
a flatness map indicating flatness of each of sections on the bonding stage; and
a flatness correction unit configured to correct a height and an inclination of the bonding stage based on the flatness map according to a position of bonding.

10. The flip chip bonder according to claim 1, further comprising:
a control unit configured to operate the vertical-position adjustment support mechanisms, wherein
the control unit comprises:
an expected deformation amount map indicating an expected deformation amount of each of sections on the bonding stage due to a pressing force when a bonding tool is pressed against the bonding stage; and
a deformation amount correction unit configured to correct a height and an inclination of the bonding stage by the expected deformation amount of the bonding stage according to a pressed position and the pressing force during bonding.

11. The flip chip bonder according to claim 2, wherein
a control unit configured to operate the vertical-position adjustment support mechanisms, wherein
the control unit comprises:
an expected deformation amount map indicating an expected deformation amount of each of sections on the bonding stage due to a pressing force when a bonding tool is pressed against the bonding stage; and
a deformation amount correction unit configured to correct a height and an inclination of the bonding stage by the expected deformation amount of the bonding stage according to a pressed position and the pressing force during bonding.

12. The flip chip bonder according to claim 3, wherein
a control unit configured to operate the vertical-position adjustment support mechanisms, wherein
the control unit comprises:
an expected deformation amount map indicating an expected deformation amount of each of sections on the bonding stage due to a pressing force when a bonding tool is pressed against the bonding stage; and
a deformation amount correction unit configured to correct a height and an inclination of the bonding stage by the expected deformation amount of the bonding stage according to a pressed position and the pressing force during bonding.

13. The flip chip bonder according to claim 1, wherein
the bonding stage comprises:
a first layer having a low thermal conductivity;
a second layer having higher thermal conductivity than that of the first layer and substantially the same thermal expansion rate as the first layer;
a third layer configured by a material similar to that of the second layer; and
a heater disposed between the second layer and the third layer.

14. The flip chip bonder according to claim 2, wherein
the bonding stage comprises:
a first layer having a low thermal conductivity;
a second layer having higher thermal conductivity than that of the first layer and substantially the same thermal expansion rate as the first layer;
a third layer configured by a material similar to that of the second layer; and
a heater disposed between the second layer and the third layer.

15. The flip chip bonder according to claim 3, wherein
the bonding stage comprises:
a first layer having a low thermal conductivity;
a second layer having higher thermal conductivity than that of the first layer and substantially the same thermal expansion rate as the first layer;
a third layer configured by a material similar to that of the second layer; and
a heater disposed between the second layer and the third layer.

16. A method of correcting flatness of a bonding stage of a flip chip bonder, the method comprising the steps of:
preparing a flip chip bonder comprising:
a base body;
a bonding stage for suctioning and fixing a bonding target;
a plurality of vertical-position adjustment support mechanisms attached to the base body, and respectively configured to support the bonding stage at a plurality of supporting points in a vertical direction, and to adjust positions of the respective supporting points in the vertical direction, the supporting points being provided on a side opposite of a surface for suctioning and fixing the bonding target of the bonding stage;
a connecting member configured to connect the base body with the bonding stage; and
a control unit configured to operate the vertical-position adjustment support mechanisms;
preparing a flatness map indicating flatness of each of sections on the bonding stage within the control unit; and
correcting a height and an inclination of the bonding stage based on the flatness map according to a position of bonding by causing the control unit to operate the plurality of vertical-position adjustment support mechanisms.

17. The method of correcting flatness of a bonding stage according to claim 16, wherein
the connecting member:
restrains movement of the bonding stage relative to the base body in directions along a first axis and a second axis, the first axis being a direction along the surface of the bonding stage, the second axis being a direction along the surface of the bonding stage but perpendicular to the first axis; and allows first twisting of the bonding stage relative to the base body about the first axis, second twisting of the bonding stage relative to the base body about the second axis, and movement of the bonding stage relative to the base body in the vertical direction.

18. A method of correcting a deformation amount of a bonding stage of a flip chip bonder, the method comprising the steps of:

preparing a flip chip bonder comprising:
  a base body;
  a bonding stage for suctioning and fixing a bonding target;
  a plurality of vertical-position adjustment support mechanisms attached to the base body, and respectively configured to support the bonding stage at a plurality of supporting points in a vertical direction, and to adjust positions of the respective supporting points in the vertical direction, the supporting points being provided on a side opposite of a surface for suctioning and fixing the bonding target of the bonding stage;
  a connecting member configured to connect the base body with the bonding stage; and
  a control unit configured to operate the vertical-position adjustment support mechanisms;

preparing an expected deformation amount map indicating an expected deformation amount of each of sections on the bonding stage due to a pressing force when a bonding tool is pressed against the bonding stage within the control unit; and correcting a height and an inclination of the bonding stage by the expected deformation amount of the bonding stage according to a pressed position and the pressing force during bonding by causing the control unit to operate the plurality of vertical-position adjustment support mechanisms.

19. The method of correcting a deformation amount of a bonding stage of a flip chip bonder according to claim 18, wherein the connecting member:
  restrains movement of the bonding stage relative to the base body in directions along a first axis and a second axis, the first axis being a direction along the surface of the bonding stage, the second axis being a direction along the surface of the bonding stage but perpendicular to the first axis; and
  allows first twisting of the bonding stage relative to the base body about the first axis, second twisting of the bonding stage relative to the base body about the second axis, and movement of the bonding stage relative to the base body in the vertical direction.

* * * * *